(12) United States Patent
Negishi

(10) Patent No.: US 11,346,883 B2
(45) Date of Patent: May 31, 2022

(54) PROBE SYSTEMS AND METHODS FOR TESTING A DEVICE UNDER TEST

(71) Applicant: FormFactor, Inc., Livermore, CA (US)

(72) Inventor: Kazuki Negishi, Hillsboro, OR (US)

(73) Assignee: FormFactor, Inc., Livermore, CA (US)

( * ) Notice: Subject to any disclaimer, the term of this patent is extended or adjusted under 35 U.S.C. 154(b) by 52 days.

(21) Appl. No.: 17/076,279

(22) Filed: Oct. 21, 2020

(65) Prior Publication Data
US 2021/0132145 A1 May 6, 2021

Related U.S. Application Data

(60) Provisional application No. 62/930,959, filed on Nov. 5, 2019.

(51) Int. Cl.
*G01R 31/28* (2006.01)
*G01R 1/067* (2006.01)

(52) U.S. Cl.
CPC ..... *G01R 31/2891* (2013.01); *G01R 1/06772* (2013.01)

(58) Field of Classification Search
CPC ............. G01R 31/2891; G01R 1/06772
See application file for complete search history.

(56) References Cited

U.S. PATENT DOCUMENTS

| 5,631,572 A | 5/1997 | Sheen et al. |
| 9,083,073 B2* | 7/2015 | Yang ................... H01Q 1/243 |
| 10,281,518 B2* | 5/2019 | Negishi ............ G01R 31/2601 |
| 2008/0186048 A1 | 8/2008 | Lui et al. |
| 2014/0370821 A1 | 12/2014 | Guterman et al. |
| 2017/0162692 A1 | 6/2017 | Brindle et al. |
| 2018/0284155 A1 | 10/2018 | Beng et al. |

\* cited by examiner

*Primary Examiner* — Paresh Patel
(74) *Attorney, Agent, or Firm* — Dascenzo Gates Intellectual Property Law, P.C.

(57) ABSTRACT

Probe systems and methods for testing a device under test are disclosed herein. The probe systems include an electrically conductive ground loop and a structure that is electrically connected to a ground potential via at least a region of the electrically conductive ground loop. The probe systems also include nonlinear circuitry. The nonlinear circuitry is configured to resist flow of electric current within the ground loop when a voltage differential across the nonlinear circuitry is less than a threshold voltage differential and permit flow of electric current within the ground loop when the voltage differential across the nonlinear circuitry is greater than the threshold voltage differential. The methods include positioning a device under test (DUT) within a probe system that includes an electrically conductive ground loop and nonlinear circuitry. The methods also include selectively resisting and permitting electric current flow within the ground loop and through the nonlinear circuitry.

20 Claims, 5 Drawing Sheets

PROBE SYSTEMS AND METHODS FOR TESTING A DEVICE UNDER TEST

RELATED APPLICATION

This application claims priority to U.S. Provisional Patent Application No. 62/930,959, which was filed on Nov. 5, 2019, and the complete disclosure of which is hereby incorporated by reference.

FIELD OF THE DISCLOSURE

The present disclosure relates generally to probe systems and methods for testing a device under test.

BACKGROUND OF THE DISCLOSURE

Probe systems may be utilized to test the operation of a device under test (DUT). In specific examples, the DUT may include a semiconductor device, and the probe system may be configured to electrically test the operation of the DUT, such as by providing a test signal to the DUT and/or by receiving a resultant signal from the DUT.

In some configurations, one or more ground loops may be at least partially defined by the probe systems. The one or more ground loops may introduce electrical noise into a testing environment of the probe systems, which may decrease an accuracy of tests performed by the probe systems. Thus, there exists a need for improved probe systems and methods for testing a device under test.

SUMMARY OF THE DISCLOSURE

Probe systems and methods for testing a device under test are disclosed herein. The probe systems include an electrically conductive ground loop and a structure that is electrically connected to a ground potential via at least a region of the electrically conductive ground loop. The probe systems also include nonlinear circuitry. The nonlinear circuitry is configured to resist flow of electric current within the ground loop when a voltage differential across the nonlinear circuitry is less than a threshold voltage differential. The nonlinear circuitry also is configured to permit flow of electric current within the ground loop when the voltage differential across the nonlinear circuitry is greater than the threshold voltage differential.

The methods include positioning a device under test (DUT) within a probe system that includes an electrically conductive ground loop and nonlinear circuitry. The methods also include resisting electric current flow within the ground loop, with the nonlinear circuitry, when a voltage differential across the nonlinear circuitry is less than a threshold voltage differential. The methods further include permitting electric current flow within the ground loop and through the nonlinear circuitry when the voltage differential across the nonlinear circuitry is greater than the threshold voltage differential.

DETAILED DESCRIPTION AND BEST MODE OF THE DISCLOSURE

Figure 1:
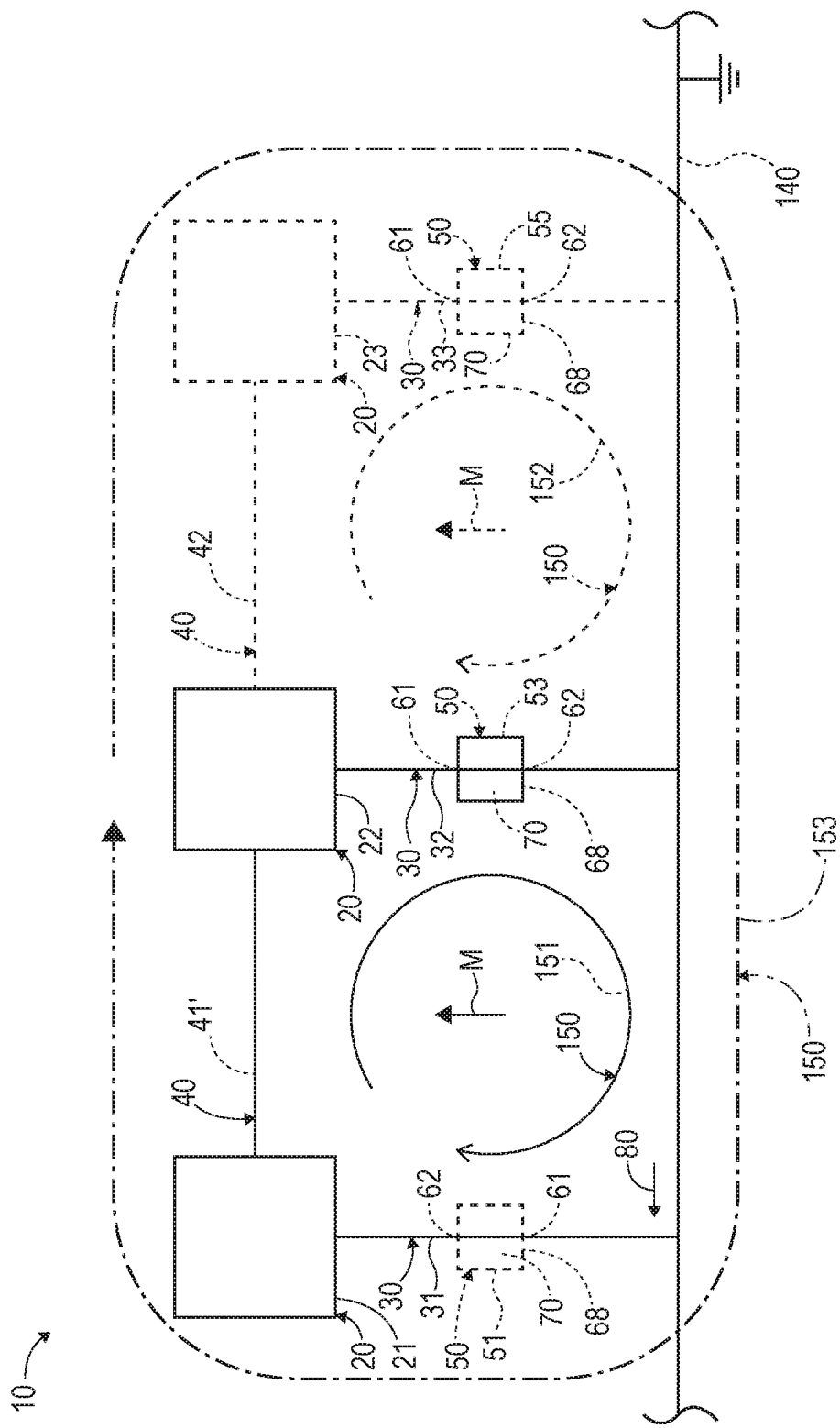
FIG. 1 is a schematic illustration of examples of a probe system according to the present disclosure.

FIGS. 1-6 provide examples of probe systems 10 that may perform methods 200, according to the present disclosure. Elements that serve a similar, or at least substantially similar, purpose are labeled with like numbers in FIGS. 1-6, and these elements may not be discussed in detail herein with reference to each of FIGS. 1-6. Similarly, all elements may not be labeled in each of FIGS. 1-6, but reference numerals associated therewith may be utilized herein for consistency. Elements, components, and/or features that are discussed herein with reference to one or more of FIGS. 1-6 may be included in and/or utilized with any of FIGS. 1-6 without departing from the scope of the present disclosure.

In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

Figure 2:
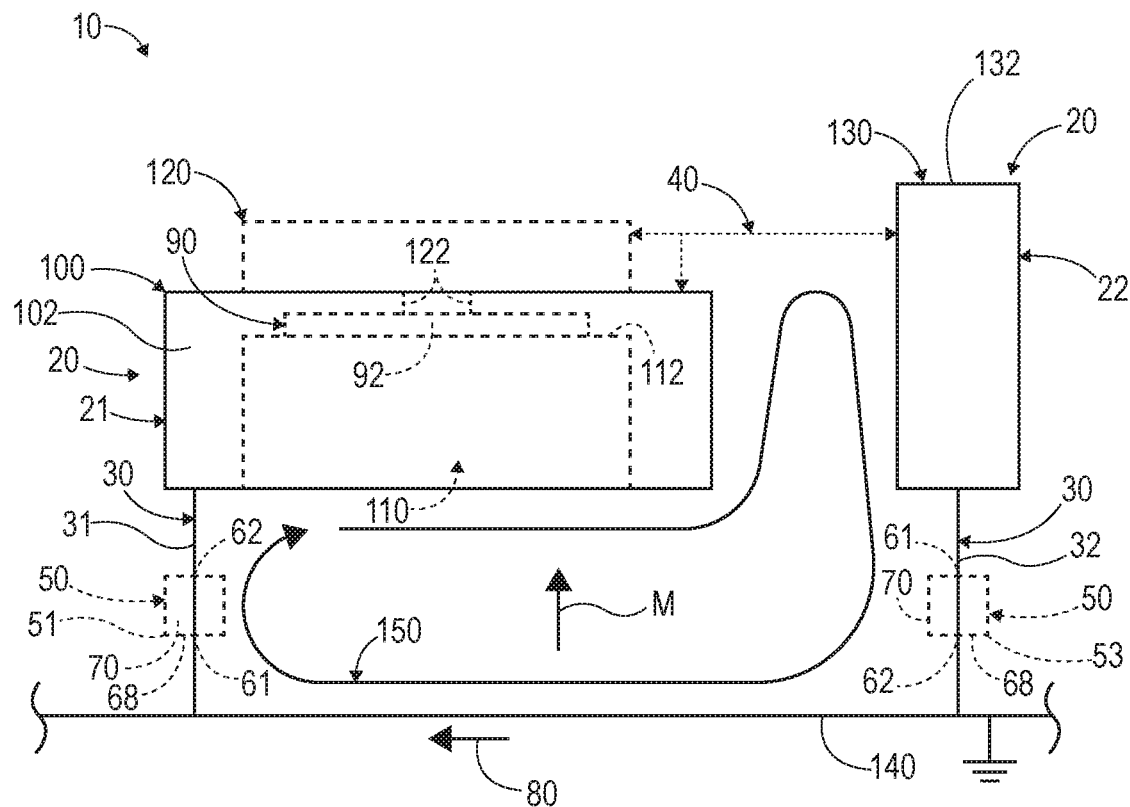
FIG. 2 is a schematic illustration of examples of a probe system according to the present disclosure.

FIGS. 1-2 are schematic illustrations of examples of probe systems 10, according to the present disclosure, that may be utilized to test a device under test (DUT). As illustrated in FIGS. 1-2, probe systems 10 include a plurality of structures 20, including a first structure 21 and a second structure 22. First structure 21 is electrically connected to a ground potential via a structure ground conductor 30 in the form of a first structure ground conductor 31. Similarly, second structure 22 is electrically connected to the ground potential via structure ground conductor 30 in the form of a second structure ground conductor 32.

As also illustrated in FIGS. 1-2, probe systems 10 include an intermediate ground conductor 40 that electrically interconnects first structure 21 and second structure 22. Intermediate ground conductor 40 may be electrically connected to the ground potential via first structure 21 and first structure ground conductor 31. Intermediate ground conductor 40 also may be electrically connected to the ground potential via second structure 22 and second structure ground conductor 32.

Figure 5:
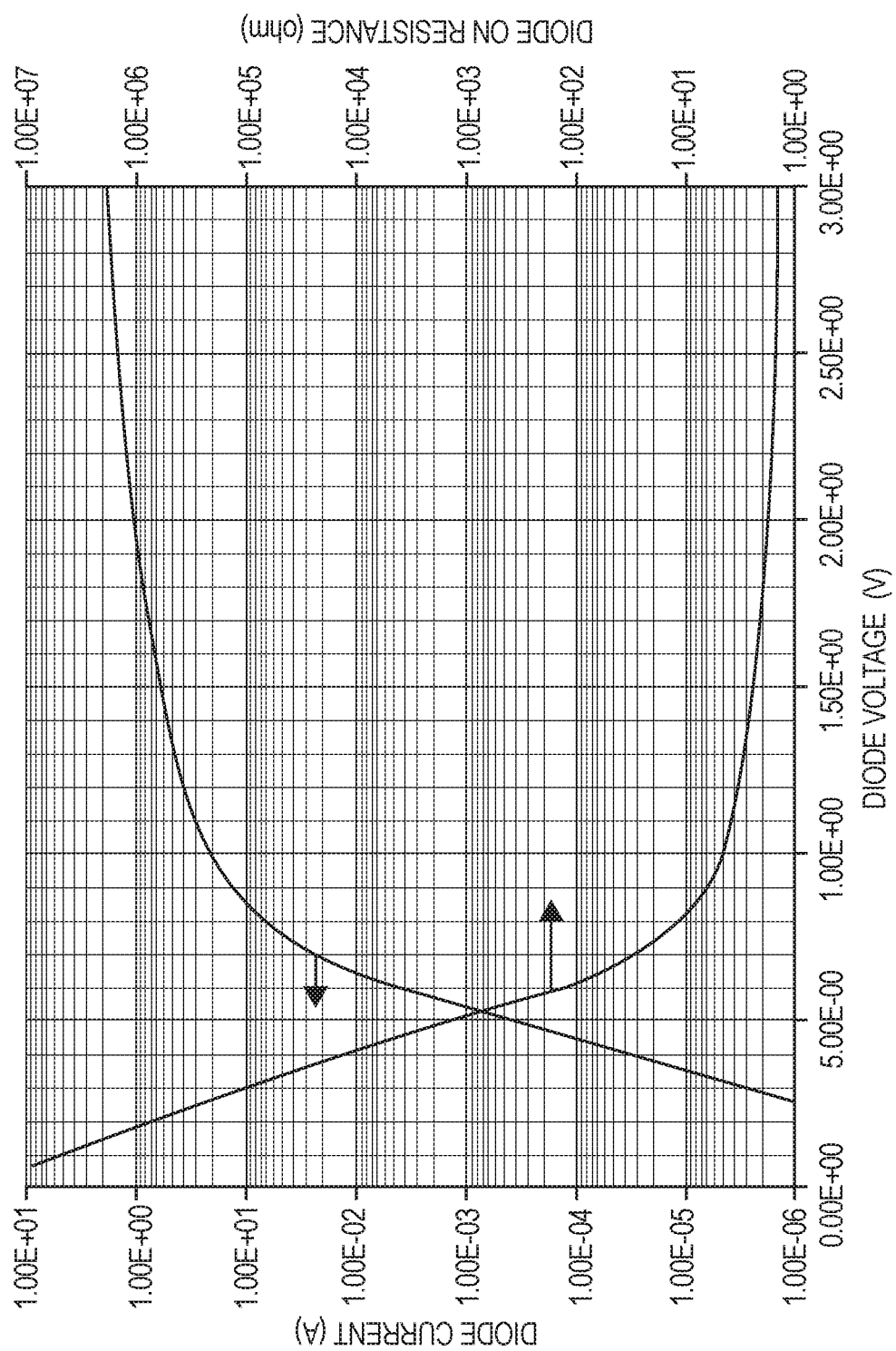
FIG. 5 is a plot illustrating current and resistance as a function of voltage for nonlinear circuitry in the form of a diode pack, according to the present disclosure.

As further illustrated in FIGS. 1-2, probe systems 10 also include nonlinear circuitry 50, which also may be referred to herein as a nonlinear impedance device 50. As used herein, the phrase "nonlinear circuitry" is utilized to indicate one or more circuit elements that collectively exhibit a nonlinear current vs. voltage curve. As discussed in more detail herein, electric current flow through the nonlinear circuitry is low, or negligible, for voltage drops across the nonlinear circuitry that are less than a threshold voltage drop. However, for voltage drops across the nonlinear circuitry that are greater than the threshold voltage drop, the electric current flow through the nonlinear circuitry increases substantially. An example of nonlinear circuitry 50 includes a diode pack 68, examples of which are disclosed herein. Additional examples of nonlinear circuitry 50 include a power transistor with included voltage-sensitive device, a power MOFSET with included voltage-sensitive device, and/or a transient voltage suppressor (TVS). Examples of the nonlinear current vs. voltage curve are illustrated in FIG. 5 and discussed in more detail herein.

Nonlinear circuitry 50 may be positioned, within probe system 10, such that first structure 21, first structure ground conductor 31, second structure 22, second structure ground conductor 32, intermediate ground conductor 40, and nonlinear circuitry 50 together and/or at least partially define a ground loop 150. Ground loop 150 also may be referred to herein as a continuous loop of electrically conductive material 150 and/or as an electrically conductive ground loop 150.

Each of the components of ground loop 150 may be defined by an electrically conductive material, such as a metal. However, ground loop 150 may not be defined by perfect electrical conductors and instead may include, or may be referred to herein as including, a plurality of impedances. As examples, first structure ground conductor 31, the connection between first structure ground conductor 31 and first structure 21, and/or the connection between first structure ground conductor 31 and the ground potential each may have and/or define a generally small, but finite, corresponding electrical impedance. Additionally or alternatively, second structure ground conductor 32, the connection between second structure ground conductor 32 and second structure 22, and/or the connection between second structure ground conductor 32 and the ground potential each may have and/or define a generally small, but finite, corresponding electrical impedance. Additionally or alternatively, intermediate ground conductor 40, the connection between intermediate ground conductor 40 and first structure 21, and/or the connection between intermediate ground conductor 40 and second structure 22 each may have and/or define a generally small, but finite, corresponding electrical impedance. Additionally or alternatively, the ground potential may be provided by a facilities ground conductor 140, which may have and/or define a generally small, but finite, corresponding electrical impedance.

During operation of probe systems 10, the probe system and/or ground loop 150 thereof may be positioned within an environment that may include a magnetic field M. The presence of magnetic field M may induce an electric current 80 flow within ground loop 150, and this electric current flow may produce and/or generate electrical noise. The electrical noise may increase noise in and/or may decrease an accuracy of electrical tests performed by probe system 10.

However, probe systems 10, according to the present disclosure, that include nonlinear circuitry 50 within ground loop 150 may decrease, or may significantly decrease, a magnitude of electric current 80 that flows within the ground loop. This decrease in electric current flow may decrease, or significantly decrease, the electrical noise generated by the electric current flow, thereby permitting probe systems 10, according to the present disclosure, to perform higher accuracy and/or lower noise tests when compared to prior art probe systems that define corresponding ground loops but that do not include nonlinear circuitry 50 within the corresponding ground loops.

Figure 3:
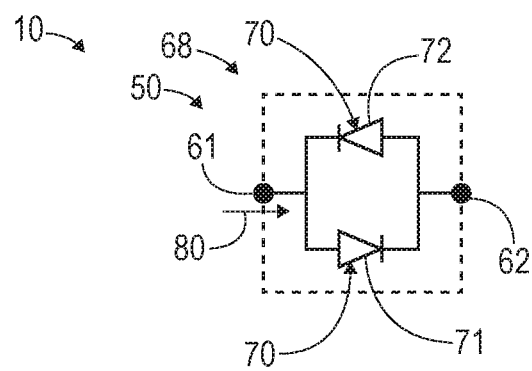
FIG. 3 is a schematic illustration of an example of nonlinear circuitry, in the form of a diode pack, that may be utilized in probe systems, according to the present disclosure.

FIG. 3 is a schematic illustration of an example of nonlinear circuitry 50, in the form of a diode pack 68, that may be utilized in probe systems 10, according to the present disclosure. Diode pack 68 of FIG. 3 may include and/or be a more detailed illustration of nonlinear circuitry 50 and/or of diode packs 68 illustrated in FIGS. 1-2 and discussed herein with reference thereto. As such, any of the structures, functions, and/or features of diode packs 68 of FIG. 3 may be included in and/or utilized with nonlinear circuitry 50 and/or diode packs 68 of FIGS. 1-2 without departing from the scope of the present disclosure. Similarly, any of the structures, functions, and/or features of probe systems 10, of nonlinear circuitry 50, and/or diode packs 68 of FIGS. 1-2 may be included in and/or utilized with nonlinear circuitry 50 and/or diode packs 68 of FIG. 3 without departing from the scope of the present disclosure.

Diode pack 68 also may be referred to herein as a double back power diode 68 and/or as a double back power diode pack 68. Nonlinear circuitry 50 and/or diode pack 68 may include a first terminal 61 and a second terminal 62. Diode pack 68 also may include a plurality of diodes 70, including a first diode 71 and a second diode 72. First diode 71 electrically interconnects first terminal 61 and second terminal 62 at a first diode polarity, and second diode 72 electrically interconnects first terminal 61 and second terminal 62 at a second diode polarity. The second diode polarity is different from, is opposed to, and/or is opposite the first diode polarity.

As such, one diode 70, such as first diode 71, permits electric current 80 flow from first terminal 61 to second terminal 62 and resists electric current flow from second terminal 62 to first terminal 61. Conversely, another diode 70, such as second diode 72, permits electric current flow from second terminal 62 to first terminal 61 and resists electric current flow from first terminal 61 to second terminal 62.

A magnitude of electric current 80 produced within ground loop 150 by magnetic field M in the absence of diode pack 68 is expected to be relatively low, generally on the order of a few milliamps (mA). Similarly, a magnitude of a potential difference, or voltage, produced within ground loop 150 by magnetic field M also is expected to be relatively low, generally less than a millivolt (mV). These voltage values are significantly below a threshold voltage differential, or a threshold "turn-on" voltage, for silicon-based diodes (nominally 0.7 volts) or for germanium-based diodes (nominally 0.3 volts).

Thus, and as illustrated in FIG. 5, diodes 70 of diode packs 68 function as resistors, as nonlinear resistors, and/or as variable resistors, with a resistance value, that is defined by the diodes, being dictated by the voltage differential, or the forward-polarity voltage differential, across the diodes. As an example, when the forward-polarity voltage differential is 0.3 V, FIG. 5 indicates that the diode current will be approximately 2-3 microamps and the diode resistance will be approximately 80-90 kohms. Thus, at the low voltages produced by magnetic field M, electric current flow within the ground loop is nearly eliminated by diode packs 68.

It is noteworthy, however, that a significant function of ground loop 150 and/or of the various electrical conductors that define ground loop 150 is to protect a user of probe system 10 from electrical shock. Diode packs 68 also facilitate this functionality. More specifically, when the forward-polarity voltage differential across the diode pack is greater than the threshold voltage differential, the diode resistance becomes quite small, thereby permitting dissipation of potentially dangerous electric currents. Returning to FIG. 5, for forward-polarity diode voltages above approximately 0.7 V, in the case of a silicon-based diode, the diode resistance is approximately 20 ohms. This diode resistance decreases to less than 2 ohms for forward-polarity diode voltages above approximately 2.0 volts.

FIG. 5 illustrates one example of current and resistance vs. voltage for diodes 70 that may be utilized within diode packs 68 of nonlinear circuitry 50. However, and as discussed, nonlinear circuitry 50 may include any suitable structure, element, and/or elements that exhibit a nonlinear current vs. voltage curve, such as the nonlinear current vs. voltage curve that is illustrated in FIG. 5. With this in mind, nonlinear circuitry 50 may be configured such that the threshold voltage differential has any suitable value. As examples, the threshold voltage differential may be at least 0.1 volts (V), at least 0.2 V, at least 0.3 V, at least 0.4 V, at least 0.5 V, at least 0.6 V, at least 0.7 V, at least 0.8 V, at least 0.9 V, and/or at least 1 V. Additionally or alternatively, the threshold voltage differential may be at most 5 V, at most 4.5 V, at most 4 V, at most 3.5 V, at most 3 V, at most 2.5 V, at most 2 V, at most 1.5 V, at most 1 V, at most 0.9 V, at most 0.8 V, at most 0.7 V, at most 0.6 V, at most 0.5 V, and/or at most 0.4 V.

When the voltage differential across nonlinear circuitry 50 is less than the threshold voltage differential, the nonlinear circuitry may be configured to provide a threshold low-voltage resistance thereacross and/or between first terminal 61 and second terminal 62. Examples of the threshold low-voltage resistance include resistances of at least 50 ohms, at least 75 ohms, at least 100 ohms, at least 125 ohms, at least 150 ohms, at least 175 ohms, at least 200 ohms, at least 250 ohms, at least 300 ohms, at least 400 ohms, at least 500 ohms, at least 600 ohms, at least 700 ohms, at least 800 ohms, at least 900 ohms, at least 1000 ohms, at least 1250 ohms, at least 1500 ohms, at least 1750 ohms, and/or at least 2000 ohms.

Additionally or alternatively, when the voltage differential across nonlinear circuitry 50 is greater than the threshold voltage differential, the nonlinear circuitry may be configured to provide a threshold high-voltage resistance thereacross and/or between first terminal 61 and second terminal 62. Examples of the threshold high-voltage resistance include resistances of at most 100 ohms, at most 50 ohms, at most 25 ohms, at most 20 ohms, at most 15 ohms, at most 10 ohms, at most 5 ohms, at most 2.5 ohms, at most 1 ohm, and/or at most 0.5 ohms.

Stated another way, nonlinear circuitry 50 may define at least the threshold low-voltage resistance when the voltage differential across the nonlinear circuitry is less than the threshold voltage differential, and nonlinear circuitry may define the threshold high-voltage resistance when the voltage differential across the nonlinear circuitry is greater than the threshold voltage differential. The threshold low-voltage resistance may be greater than the threshold high-voltage resistance. As an example, the threshold low-voltage resistance may be a threshold resistance multiple of the threshold high-voltage resistance. Examples of the threshold resistance multiple include at least 100, at least 500, at least 1000, at least 2500, at least 5000, at least 7500, at least 10,000, at least 25,000, at least 50,000, at least 75,000, or at least 100,000.

Returning to FIG. 1, probe systems 10 may include any suitable number of structures 20 that include at least first structure 21 and second structure 22. As an example, and as illustrated in dashed lines, probe system 10 additionally may include a third structure 23. In this example, third structure 23 may be electrically connected to the ground potential via a third structure ground conductor 33. Also in this example, probe system 10 may include a first intermediate ground conductor 41, which electrically interconnects first structure 21 and second structure 22, and a second intermediate ground conductor 42, which electrically interconnects second structure 22 and third structure 23.

In such a configuration, probe system 10 may define a plurality of ground loops 150. More specifically, probe system 10 may define a first ground loop 151, as illustrated in solid lines in FIG. 1, a second ground loop 152, as illustrated in dashed lines in FIG. 1, and a third ground loop 153, as illustrated in dash-dot lines in FIG. 1.

First ground loop 151 may be at least partially defined by first structure ground conductor 31, first structure 21, first intermediate ground conductor 41, second structure 22, and second structure ground conductor 32. Second ground loop 152 may be at least partially defined by second structure ground conductor 32, second structure 22, second intermediate ground conductor 42, third structure 23, and third structure ground conductor 33. Third ground loop 153 may be at least partially defined by first structure ground conductor 31, first structure 21, first intermediate ground conductor 41, second structure 22, second intermediate ground conductor 42, third structure 23, and third structure ground conductor 33.

A facilities ground conductor 140 may provide the ground potential. In such a configuration, structure ground conductors 30 may be electrically connected to the facilities ground conductor and/or the facilities ground conductor may define a portion of first ground loop 151, second ground loop 152, and/or third ground loop 153. As examples, the facilities ground conductor may define a portion of the respective ground loop that extends between first structure ground conductor 31 and second structure ground conductor 32, between second structure ground conductor 32 and third structure ground conductor 33, and/or between first structure ground conductor 31 and third structure ground conductor 33.

It is within the scope of the present disclosure that each ground loop 150 defined by probe system 10 may include nonlinear circuitry 50. Nonlinear circuitry 50 may be positioned at any suitable, or convenient, location within the ground loop. As examples, and as illustrated in FIG. 1, nonlinear circuitry 50 may be electrically connected to, may form a portion of, and/or may be associated with first structure ground conductor 31, as indicated at 51, second structure ground conductor 32, as indicated at 53, and/or third structure ground conductor 33, as indicated at 55.

It is within the scope of the present disclosure that structures 20, including first structure 21, second structure 22, and/or third structure 23, when present, may include, be, and/or be at least partially defined by any suitable component of probe systems 10. As examples, structures 20 may include one or more of an enclosure that defines an enclosed volume configured to contain the DUT, a chuck that defines a support surface configured to support the DUT, a temperature-controlled chuck, a probe assembly that includes at least one probe configured to communicate with the DUT, a test instrument, a signal generation and analysis assembly, a temperature controller of the probe system, a chiller of the probe system, a material handling robot of the probe system, and/or a wafer handler.

The probe assembly, when present, may include and/or be an electrical probe assembly including at least one electrical probe configured to electrically communicate with the DUT and/or an optical probe assembly that includes at least one optical probe configured to optically communicate with the DUT. The signal generation and analysis assembly, when present, may be configured to provide a test signal to the DUT and/or to receive a resultant signal from the DUT.

The test instrument, when present, may be provided with probe system 10 and/or by a manufacturer of probe system 10. Additionally or alternatively, the test instrument may be provided by a user, or an end-user, of probe system 10. Examples of the test instrument include measurement instruments and/or other related equipment. With this in mind, nonlinear circuitry 50, according to the present disclosure, may be utilized to flexibly and/or modularly decrease ground loop current and/or associated electrical noise in probe systems that include any suitable number of manufacturer and/or user-supplied structures 20 that form and/or define corresponding ground loops 150.

Figure 4:
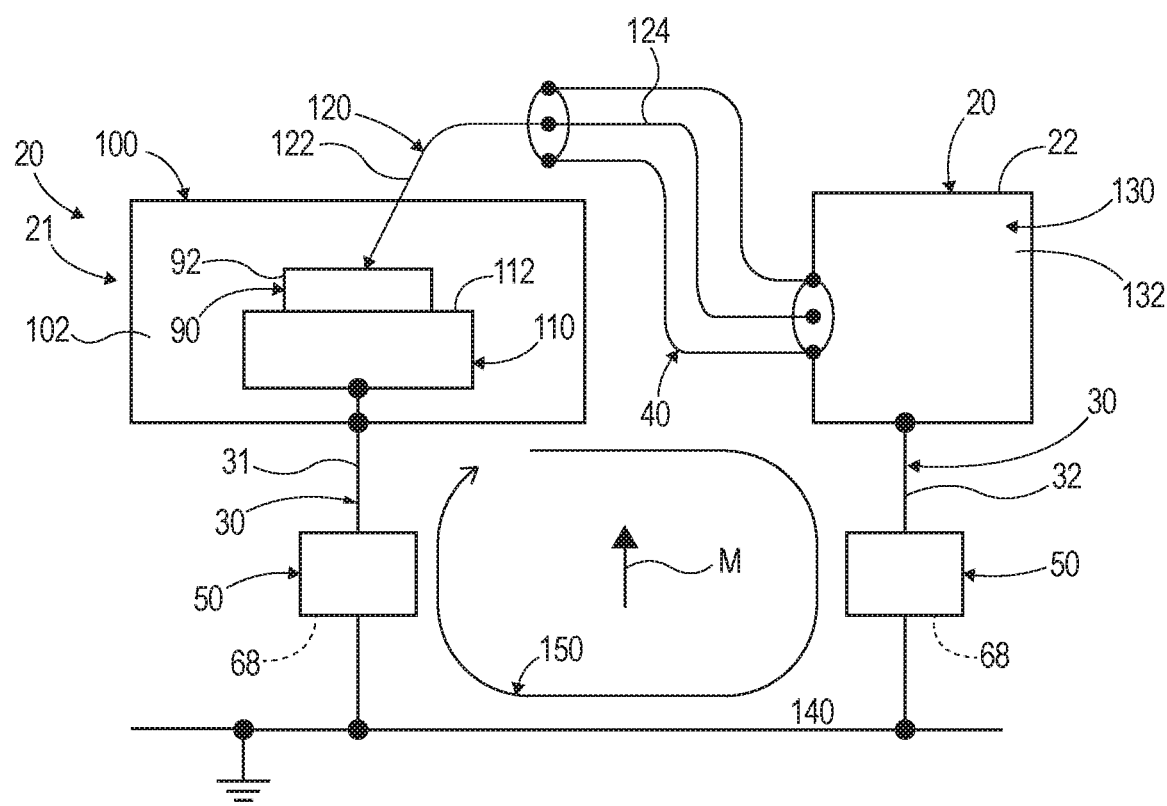
FIG. 4 is a less schematic illustration of examples of probe systems according to the present disclosure.

In a specific example, and as illustrated schematically in FIG. 2 and less schematically in FIG. 4, first structure 21 may include an enclosure 100 that defines an enclosed volume 102 configured to contain a DUT 92 that may be formed on a substrate 90. In this example, second structure 22 may include a test instrument 130, such as a signal generation and analysis assembly 132, configured to electrically test the DUT. Enclosure 100 may be electrically connected to a ground potential, such as to facilities ground conductor 140, via first structure ground conductor 31. Enclosure 100 also may be electrically connected to test instrument 130 via intermediate ground conductor 40, and test instrument 130 may be electrically connected to the ground potential via second structure ground conductor 32. In this example, probe system 10 also may include a chuck 110 that defines a support surface 112 configured to support the substrate and/or a probe assembly 120 that includes at least one probe 122 configured to provide a test signal to the DUT and/or to receive a resultant signal from the DUT. As illustrated in FIG. 4, intermediate ground conductor 40 may be configured to shield, or to electrically shield, a signal conductor 124, which may be configured to convey a test signal and/or a resultant signal between test instrument 130 and probe 122.

In such a configuration, ground loop 150 may be formed at least by first structure ground conductor 31, enclosure 100, intermediate ground conductor 40, test instrument 130, and second structure ground conductor 32. Also in such a configuration, nonlinear circuitry 50 may be included within the ground loop. As discussed in more detail herein, inclusion of nonlinear circuitry 50 within the ground loop may decrease a magnitude of electric current flow within the ground loop, such as may be caused by magnetic field M. This may decrease electrical noise within enclosed volume 102 and/or proximate DUT 92, thereby decreasing noise in electrical measurements that may be performed by the probe system.

DUT 92 may include any suitable structure that may be tested by probe system 10 and/or that may be defined by, defined on, defined in, and/or supported by substrate 90. Examples of DUT 92 include a solid state device, a semiconductor device, a logic device, a transistor, a memory device, an imaging device, a complementary metal oxide semiconductor (CMOS) imaging device, and/or a charge coupled device (CCD) sensor. Examples of substrate 90 include a semiconductor wafer, a silicon wafer, a gallium arsenide wafer, and/or a Group III-V semiconductor wafer.

Figure 6:
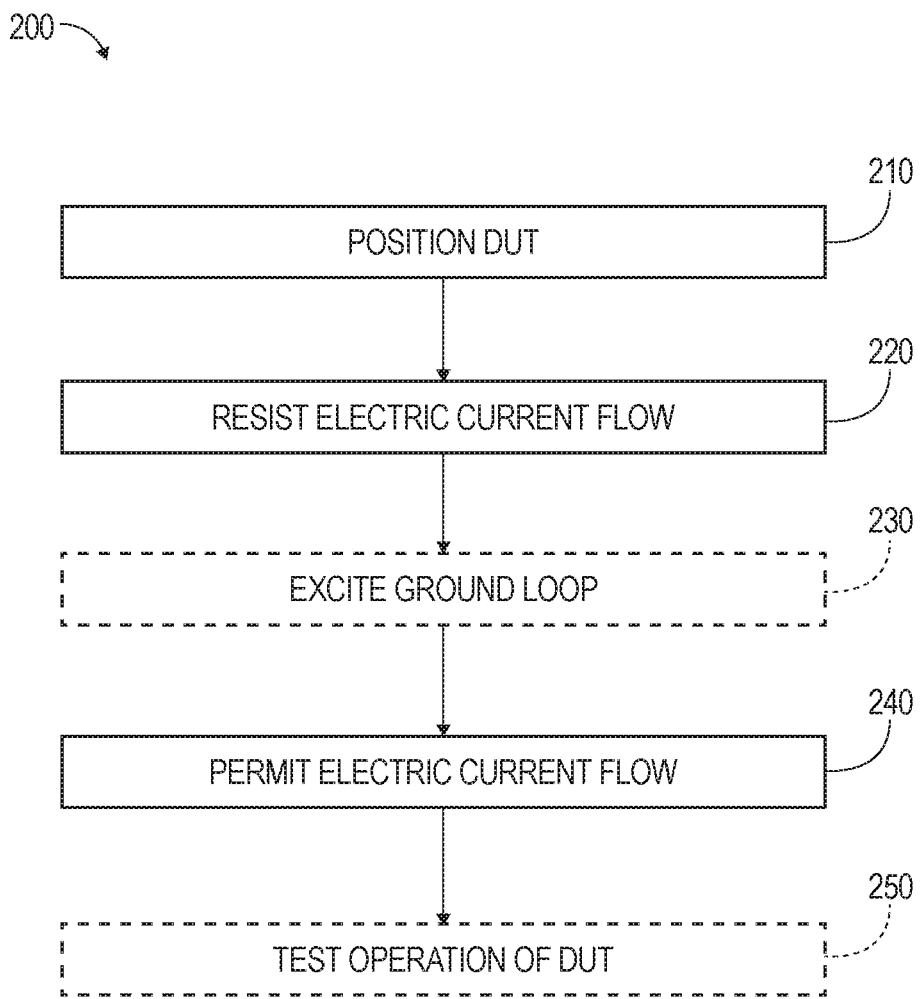
FIG. 6 is a flowchart depicting examples of methods of testing a device under test utilizing probe systems, according to the present disclosure.

FIG. 6 is a flowchart depicting examples of methods 200 of testing a device under test utilizing probe systems, according to the present disclosure. Methods 200 include positioning a device under test (DUT) at 210 and resisting electric current flow at 220. Methods 200 may include exciting a ground loop at 230. Methods 200 include permitting electric current flow in the ground loop at 240. Methods 200 further may include testing operation of the DUT at 250.

Positioning the device under test (DUT) at 210 may include positioning the device under test in and/or within a probe system. The probe system may include an electrically conductive ground loop and nonlinear circuitry that may be electrically connected to the electrically conductive ground loop. Examples of the probe system are disclosed herein with reference to probe systems 10. Examples of the electrically conductive ground loop and of the nonlinear circuitry are disclosed herein with reference to ground loops 150 and nonlinear circuitry 50, respectively.

Resisting electric current flow at 220 may include resisting electric current flow within the ground loop and/or with the nonlinear circuitry. The resisting at 220 also may include resisting the electric current flow when a voltage differential across the nonlinear circuitry, within the ground loop, is less than a threshold voltage differential, if the voltage differential is less than the threshold voltage differential, and/or responsive to the voltage differential being less than the threshold voltage differential. Additionally or alternatively, the resisting at 220 may include defining and/or establishing at least a threshold low-voltage resistance within the nonlinear circuitry and/or within the ground loop via the nonlinear circuitry. Examples of the threshold voltage differential and the threshold low-voltage resistance are disclosed herein.

The resisting at 220 may be performed with any suitable timing and/or sequence during methods 200. As examples, the resisting at 220 may be performed prior to the permitting at 240, subsequent to the permitting at 240, and/or during the testing at 250.

Exciting the ground loop at 230 may include exciting the ground loop such that the voltage differential across the nonlinear circuitry is greater than the threshold voltage differential and may be accomplished in any suitable manner. As an example, the probe system may be positioned within an environment that includes a magnetic field, and the magnetic field may induce an electric current flow within the ground loop. The magnetic field may be emitted by one or more components of probe system 10 and/or by other pieces of equipment that may be external to probe system 10 and/or within the environment.

Permitting electric current flow in the ground loop at 240 may include permitting the electric current flow through and/or within the nonlinear circuitry. This may include permitting the electric current flow when the voltage differential across the nonlinear circuitry is greater than the threshold voltage differential, if the voltage differential is greater than the threshold voltage differential, and/or responsive to the voltage differential being greater than the threshold voltage differential. Additionally or alternatively, the permitting at 240 may include defining and/or establishing at most a threshold high-voltage resistance within the nonlinear circuitry and/or within the ground loop via the non-linear circuitry. Examples of the threshold high-voltage resistance are disclosed herein. In some examples, the threshold low-voltage resistance may be greater than the threshold high-voltage resistance and/or may be a threshold multiple of the threshold high-voltage resistance. Examples of the threshold multiple are disclosed herein.

The permitting at 240 may be performed with any suitable timing and/or sequence during methods 200. As examples, the permitting at 240 may be performed subsequent to the resisting at 220, prior to the resisting at 220, subsequent to the exciting at 230, responsive to the exciting at 230, and/or during the testing at 250.

Testing operation of the DUT at 250 may include testing any suitable operation and/or parameter of the DUT in any suitable manner. As an example, the testing at 250 may include providing a test signal to the DUT. As another example, the testing at 250 may include receiving a resultant signal from the DUT. As discussed in more detail herein, the test signal may include and/or be any suitable electrical and/or optical test signal. Similarly, the resultant signal may include and/or be any suitable electrical and/or optical resultant signal.

In some examples, probe systems 10 may be referred to herein as being utilized in and/or as part of a method of testing, or of electrically testing, DUT 92. Such methods may include positioning the DUT within the probe system, such as on support surface 112 of FIG. 2. Such methods also may include resisting electric current flow within the ground loop, such as ground loop 150 of FIGS. 1-2. The resisting may include resisting with nonlinear circuitry, such as nonlinear circuitry 50 of FIGS. 1-3. The methods further may include testing the operation of the DUT, such as by providing a test signal to the DUT and/or receiving a resultant signal from the DUT. The test signal may be provided by a test instrument, such as test instrument 130 of FIG. 2, and/or the resultant signal may be received by the test instrument.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of probe systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe system for testing a device under test (DUT), the probe system comprising:

an electrically conductive ground loop;

a structure electrically connected to a ground potential via at least a region of the electrically conductive ground loop; and nonlinear circuitry electrically connected to the electrically conductive ground loop, optionally wherein the nonlinear circuitry is configured to at least one of:

(i) resist flow of electric current within the electrically conductive ground loop when a voltage differential across the nonlinear circuitry is less than a threshold voltage differential;

(ii) permit flow of electric current within the electrically conductive ground loop when the voltage differential across the nonlinear circuitry is greater than the threshold voltage differential;

(iii) define at least a threshold low-voltage resistance when the voltage differential across the nonlinear circuitry is less than the threshold voltage differential; and (iv) define at most a threshold high-voltage resistance when the voltage differential across the nonlinear circuitry is greater than the threshold voltage differential.

A2. The probe system of paragraph A1, wherein the threshold low-voltage resistance is greater than the threshold high-voltage resistance.

A3. The probe system of any of paragraphs A1-A2, wherein the threshold low-voltage resistance is a threshold resistance multiple of the threshold high-voltage resistance, wherein the threshold resistance multiple is at least 100, at least 500, at least 1000, at least 2500, at least 5000, at least 7500, at least 10,000, at least 25,000, at least 50,000, at least 75,000, or at least 100,000.

A4. The probe system of any of paragraphs A1-A3, wherein:

the structure is a first structure and is electrically connected to the ground potential via a first structure ground conductor;

the probe system further includes a second structure electrically connected to the ground potential via a second structure ground conductor;

the probe system further includes an intermediate ground conductor that electrically interconnects the first structure and the second structure; and the first structure, the first structure ground conductor, the second structure, the second structure ground conductor, the intermediate ground conductor, and the nonlinear circuitry at least partially define the electrically conductive ground loop.

A5. The probe system of any of paragraphs A1-A4, wherein the nonlinear circuitry includes at least one of:

(i) a diode pack;

(ii) a double back power diode pack;

(iii) a power transistor with included voltage-sensitive device;

(iv) a power MOFSET with included voltage-sensitive device; and (v) a transient voltage suppressor (TVS).

A6. The probe system of any of paragraphs A1-A5, wherein the nonlinear circuitry includes:

(i) a first terminal; and (ii) a second terminal;

(iii) optionally a first diode that electrically interconnects the first terminal and the second terminal at a first diode polarity; and (iv) optionally a second diode that electrically interconnects the first terminal and the second terminal at a second diode polarity that is opposite the first diode polarity.

A7. The probe system of paragraph A6, wherein the nonlinear circuitry is configured to:

(i) resist flow of electric current within the electrically conductive ground loop when a voltage differential between the first terminal and the second terminal is less than the threshold voltage differential; and (ii) permit the flow of electric current within the electrically conductive ground loop when the voltage differential between the first terminal and the second terminal is greater than the threshold voltage differential.

A8. The probe system of any of paragraphs A1-A7, wherein the threshold voltage differential is at least one of:

(i) at least 0.1 volts (V), at least 0.2 V, at least 0.3 V, at least 0.4 V, at least 0.5 V, at least 0.6 V, at least 0.7 V, at least 0.8 V, at least 0.9 V, or at least 1 V; and (ii) at most 5 V, at most 4.5 V, at most 4 V, at most 3.5 V, at most 3 V, at most 2.5 V, at most 2 V, at most 1.5 V, at most 1 V, at most 0.9 V, at most 0.8 V, at most 0.7 V, at most 0.6 V, at most 0.5 V, or at most 0.4 V.

A9. The probe system of any of paragraphs A6-A8, wherein the nonlinear circuitry is configured to provide the threshold low-voltage resistance between the first terminal and the second terminal when the voltage differential is less than the threshold voltage differential.

A10. The probe system of any of paragraphs A1-A9, wherein the threshold low-voltage resistance is at least 50 ohms, at least 75 ohms, at least 100 ohms, at least 125 ohms, at least 150 ohms, at least 175 ohms, at least 200 ohms, at least 250 ohms, at least 300 ohms, at least 400 ohms, at least 500 ohms, at least 600 ohms, at least 700 ohms, at least 800 ohms, at least 900 ohms, at least 1000 ohms, at least 1250 ohms, at least 1500 ohms, at least 1750 ohms, or at least 2000 ohms.

A11. The probe system of any of paragraphs A6-A10, wherein the nonlinear circuitry is configured to provide the threshold high-voltage resistance between the first terminal and the second terminal when the voltage differential is greater than the threshold voltage differential.

A12. The probe system of any of paragraphs A1-A11, wherein the threshold high-voltage resistance is at most 100 ohms, at most 50 ohms, at most 25 ohms, at most 20 ohms, at most 15 ohms, at most 10 ohms, at most 5 ohms, at most 2.5 ohms, at most 1 ohm, or at most 0.5 ohms.

A13. The probe system of any of paragraphs A1-A12, wherein at least one of the structure, a/the first structure, and a/the second structure includes at least one of:

(i) an enclosure that defines an enclosed volume configured to contain the DUT;

(ii) a chuck that defines a support surface configured to support the DUT;

(iii) a temperature-controlled chuck;
(iv) a probe assembly including at least one probe configured to communicate with the DUT;
(v) a test instrument;
(vi) a signal generation and analysis assembly configured to at least one of provide a test signal to the DUT and receive a resultant signal from the DUT;
(vii) a temperature controller of the probe system;
(viii) a chiller of the probe system;
(ix) a material handling robot of the probe system; and
(x) a wafer handler.

A14. The probe system of any of paragraphs A1-A13, wherein the DUT is defined on a substrate, optionally wherein the probe system includes the substrate.

A15. The probe system of paragraph A14, wherein the substrate includes at least one of a semiconductor wafer, a silicon wafer, a gallium arsenide wafer, and a Group III-V semiconductor wafer.

A16. The probe system of any of paragraphs A1-A15, wherein the DUT includes at least one of:
(i) a solid state device;
(ii) a semiconductor device;
(iii) a logic device;
(iv) a transistor;
(v) a memory device;
(vi) an imaging device;
(vii) a complementary metal oxide semiconductor (CMOS) imaging device; and/or
(viii) a charge coupled device (CCD) sensor.

A17. The probe system of any of paragraphs A1-A16, wherein the probe system includes the DUT.

A18. The probe system of any of paragraphs A1-A17 when dependent from paragraph A4, wherein the first structure includes an/the enclosure, wherein the enclosure defines an/the enclosed volume configured to contain the DUT.

A19. The probe system of paragraph A18, wherein the probe system further includes a/the chuck that defines a/the support surface configured to support the DUT.

A20. The probe system of any of paragraphs A18-A19, wherein the second structure includes a test instrument configured to electrically test the DUT.

A21. The probe system of paragraph A20, wherein the test instrument includes a/the signal generation and analysis assembly.

A22. The probe system of any of paragraphs A18-A21, wherein the probe system further includes a/the probe assembly configured to at least one of provide a/the test signal to the DUT and receive a/the resultant signal from the DUT.

A23. The probe system of any of paragraphs A1-A12, wherein the ground potential is defined by a facilities ground conductor.

A24. The probe system of paragraph A23 when dependent from paragraph A4, wherein at least one of:
(i) the first structure ground conductor is electrically connected to the facilities ground conductor; and
(ii) the second structure ground conductor is electrically connected to the facilities ground conductor.

A25. The probe system of any of paragraphs A23-A24 when dependent from paragraph A4, wherein the first structure, the first structure ground conductor, the second structure, the second structure ground conductor, the intermediate ground conductor, the facilities ground conductor, and the nonlinear circuitry at least partially define the electrically conductive ground loop.

A26. The probe system of any of paragraphs A1-A25, wherein the probe system further includes at least one of:
(i) a/the first structure ground conductor;
(ii) a/the second structure ground conductor; and
(iii) a/the facilities ground conductor.

B1. A method of testing a device under test (DUT), the method comprising:
positioning the DUT within a probe system, wherein the probe system includes an electrically conductive ground loop and nonlinear circuitry electrically connected to the electrically conductive ground loop;
resisting electric current flow within the electrically conductive ground loop, with the nonlinear circuitry, when a voltage differential across the nonlinear circuitry is less than a threshold voltage differential; and permitting electric current flow within the electrically conductive ground loop and through the nonlinear circuitry when the voltage differential across the nonlinear circuitry is greater than the threshold voltage differential.

B2. The method of paragraph B1, wherein the probe system includes any suitable structure of any of the probe systems of any of paragraphs A1-A26.

B3. The method of any of paragraphs B1-B2, wherein the method further includes exciting the electrically conductive ground loop such that the voltage differential across the nonlinear circuitry is greater than the threshold voltage differential.

B4. The method of any of paragraphs B1-B3, wherein the method further includes at least one of:
(i) performing the resisting subsequent to the permitting; and
(ii) performing the permitting subsequent to the resisting.

B5. The method of any of paragraphs B1-B4, wherein the resisting includes defining at least a threshold low-voltage resistance with the nonlinear circuitry.

B6. The method of any of paragraphs B1-B5, wherein the permitting includes defining at most a threshold high-voltage resistance with the nonlinear circuitry.

B7. The method of paragraph B6 when dependent from paragraph B5, wherein the threshold low-voltage resistance is greater than the threshold high-voltage resistance.

B8. The method of any of paragraphs B6-B7 when dependent from paragraph B5, wherein the threshold low-voltage resistance is at least a threshold resistance multiple of the threshold high-voltage resistance, wherein the threshold resistance multiple is at least 100, at least 500, at least 1000, at least 2500, at least 5000, at least 7500, at least 10,000, at least 25,000, at least 50,000, at least 75,000, or at least 100,000.

B9. The method of any of paragraphs B1-B8, wherein the method further includes testing operation of the DUT.

B10. The method of paragraph B9, wherein the testing includes at least one of:
(i) providing a test signal to the DUT; and
(ii) receiving a resultant signal from the DUT.

B11. The method of any of paragraphs B9-B10, wherein the method includes performing the resisting during the testing.

B12. The method of any of paragraphs B9-B11, wherein the method includes performing the permitting during the testing.

C1. The use of nonlinear circuitry, within a ground loop of a probe system, to selectively permit and to selectively restrict electric current flow within the ground loop.

INDUSTRIAL APPLICABILITY

The probe systems and methods disclosed herein are applicable to the semiconductor test industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe system for testing a device under test (DUT), the probe system comprising:
   an electrically conductive ground loop;
   a structure electrically connected to a ground potential via at least a region of the electrically conductive ground loop; and
   nonlinear circuitry electrically connected to the electrically conductive ground loop, wherein the nonlinear circuitry is configured to:
   (i) resist flow of electric current within the electrically conductive ground loop when a voltage differential across the nonlinear circuitry is less than a threshold voltage differential; and
   (ii) permit flow of electric current within the electrically conductive ground loop when the voltage differential across the nonlinear circuitry is greater than the threshold voltage differential.

2. The probe system of claim 1, wherein the nonlinear circuitry is configured to:
   (i) define at least a threshold low-voltage resistance when the voltage differential across the nonlinear circuitry is less than the threshold voltage differential; and
   (ii) define at most a threshold high-voltage resistance when the voltage differential across the nonlinear circuitry is greater than the threshold voltage differential, wherein the threshold low-voltage resistance is greater than the threshold high-voltage resistance.

3. The probe system of claim 2, wherein the threshold low-voltage resistance is a threshold resistance multiple of the threshold high-voltage resistance, wherein the threshold resistance multiple is at least 100.

4. The probe system of claim 1, wherein:
   (i) the structure is a first structure and is electrically connected to the ground potential via a first structure ground conductor;
   (ii) the probe system further includes a second structure electrically connected to the ground potential via a second structure ground conductor;
   (iii) the probe system further includes an intermediate ground conductor that electrically interconnects the first structure and the second structure; and
   (iv) the first structure, the first structure ground conductor, the second structure, the second structure ground conductor, the intermediate ground conductor, and the nonlinear circuitry at least partially define the electrically conductive ground loop.

5. The probe system of claim 4, wherein:
   (i) the first structure includes an enclosure, wherein the enclosure defines an enclosed volume configured to contain the DUT; and
   (ii) wherein the second structure includes a test instrument configured to electrically test the DUT.

6. The probe system of claim 5, wherein the probe system further includes:
   (i) a chuck that defines a support surface configured to support the DUT; and
   (ii) a probe assembly configured to at least one of provide a test signal to the DUT and receive a resultant signal from the DUT.

7. The probe system of claim 5, wherein the test instrument includes a signal generation and analysis assembly.

8. The probe system of claim 1, wherein the nonlinear circuitry includes at least one of:
   (i) a diode pack;
   (ii) a double back power diode pack;
   (iii) a power transistor with included voltage-sensitive device;
   (iv) a power MOFSET with included voltage-sensitive device; and
   (v) a transient voltage suppressor (TVS).

9. The probe system of claim 1, wherein the nonlinear circuitry includes a diode pack, wherein the diode pack includes:
   (i) a first terminal;
   (ii) a second terminal;
   (iii) a first diode that electrically interconnects the first terminal and the second terminal at a first diode polarity; and
   (iv) a second diode that electrically interconnects the first terminal and the second terminal at a second diode polarity that is opposite the first diode polarity.

10. The probe system of claim 1, wherein the nonlinear circuitry includes a first terminal and a second terminal, and further wherein the nonlinear circuitry is configured to:
    (i) resist flow of electric current within the electrically conductive ground loop when a voltage differential between the first terminal and the second terminal is less than the threshold voltage differential; and
    (ii) permit the flow of electric current within the electrically conductive ground loop when the voltage differential between the first terminal and the second terminal is greater than the threshold voltage differential.

11. The probe system of claim 10, wherein the nonlinear circuitry is configured to provide the threshold low-voltage resistance between the first terminal and the second terminal when the voltage differential is less than the threshold voltage differential, and further wherein the threshold low-voltage resistance is at least 500 ohms.

12. The probe system of claim 10, wherein the nonlinear circuitry is configured to provide the threshold high-voltage resistance between the first terminal and the second terminal when the voltage differential is greater than the threshold voltage differential, and further wherein the threshold high-voltage resistance is at most 10 ohms.

13. The probe system of claim 1, wherein the structure includes at least one of:
   (i) an enclosure that defines an enclosed volume configured to contain the DUT;
   (ii) a chuck that defines a support surface configured to support the DUT;
   (iii) a temperature-controlled chuck;
   (iv) a probe assembly including at least one probe configured to communicate with the DUT;
   (v) a test instrument;
   (vi) a signal generation and analysis assembly configured to at least one of provide a test signal to the DUT and receive a resultant signal from the DUT;
   (vii) a temperature controller of the probe system;
   (viii) a chiller of the probe system;
   (ix) a material handling robot of the probe system; and
   (x) a wafer handler.

14. The probe system of claim 1, wherein the threshold voltage differential is at least 0.1 volts (V) and at most 5 V.

15. A method of testing a device under test (DUT), the method comprising:
   positioning the DUT within a probe system, wherein the probe system includes an electrically conductive ground loop and nonlinear circuitry electrically connected to the electrically conductive ground loop;
   resisting electric current flow within the electrically conductive ground loop, with the nonlinear circuitry, when a voltage differential across the nonlinear circuitry is less than a threshold voltage differential; and
   permitting electric current flow within the ground loop and through the nonlinear circuitry when the voltage differential across the nonlinear circuitry is greater than the threshold voltage differential.

16. The method of claim 15, wherein the method further includes exciting the electrically conductive ground loop such that the voltage differential across the nonlinear circuitry is greater than the threshold voltage differential.

17. The method of claim 15, wherein the method further includes at least one of:
   (i) performing the resisting subsequent to the permitting; and
   (ii) performing the permitting subsequent to the resisting.

18. The method of claim 15, wherein:
   (i) the resisting includes defining at least a threshold low-voltage resistance with the nonlinear circuitry; and
   (ii) the permitting includes defining at most a threshold high-voltage resistance with the nonlinear circuitry, wherein the threshold low-voltage resistance is greater than the threshold high-voltage resistance.

19. The method of claim 18, wherein the threshold low-voltage resistance is at least a threshold resistance multiple of the threshold high-voltage resistance, and further wherein the threshold resistance multiple is at least 100.

20. The method of claim 15, wherein the method further includes testing operation of the DUT, and further wherein the method includes:
   (i) performing the resisting during the testing; and
   (ii) performing the permitting during the testing.

* * * * *